(12) United States Patent
Kainuma et al.

(10) Patent No.: US 9,773,747 B2
(45) Date of Patent: Sep. 26, 2017

(54) WIRING SUBSTRATE AND METHOD FOR MANUFACTURING WIRING SUBTRATE

(71) Applicant: SHINKO ELECTRIC INDUSTRIES CO., LTD., Nagano-ken (JP)

(72) Inventors: Kazuhiro Kainuma, Nagano (JP); Toshimitsu Omiya, Nagano-ken (JP); Koichi Hara, Nagano (JP); Junji Sato, Nagano (JP)

(73) Assignee: Shinko Electric Industries Co., Ltd., Nagano-ken (JP)

( * ) Notice: Subject to any disclaimer, the term of this patent is extended or adjusted under 35 U.S.C. 154(b) by 25 days.

(21) Appl. No.: 13/868,449

(22) Filed: Apr. 23, 2013

(65) Prior Publication Data

US 2013/0285254 A1    Oct. 31, 2013

(30) Foreign Application Priority Data

Apr. 26, 2012  (JP) ................................ 2012-100926

(51) Int. Cl.
*H01L 23/00* (2006.01)
*H01L 23/498* (2006.01)
(Continued)

(52) U.S. Cl.
CPC ........ *H01L 24/18* (2013.01); *H01L 23/49822* (2013.01); *H01L 23/5389* (2013.01);
(Continued)

(58) Field of Classification Search
CPC ........... H01L 2224/32225; H01L 24/16; H01L 2924/1532; H01L 23/5389; H01L 24/82;
(Continued)

(56) References Cited

U.S. PATENT DOCUMENTS

| 8,130,507 B2 * | 3/2012 | Origuchi | ........... H01L 23/49838 |
| | | | 174/260 |
| 2002/0132096 A1 | 9/2002 | Takeuchi et al. | |

(Continued)

FOREIGN PATENT DOCUMENTS

| JP | 2003-152317 | 5/2003 |
| JP | 2007-005768 | 1/2007 |

(Continued)

OTHER PUBLICATIONS

Notification of Reasons for Rejection w/ English Translation; JP Appln. No. 2012-100926; dated Dec. 8, 2015.

*Primary Examiner* — Julio J Maldonado
*Assistant Examiner* — Nga Doan
(74) *Attorney, Agent, or Firm* — Fish & Richardson P.C.

(57) ABSTRACT

A wiring substrate includes a core substrate. The core substrate includes a first surface, a second surface, and an opening extending through the core substrate between the first and second surfaces. A first conductive film is formed on the first surface and covers the opening. A second conductive film is formed on the second surface. The second conductive film covers the opening. An electronic component is arranged in the opening and connected to the first conductive film. An insulator fills the opening. A first wiring portion includes alternately stacked insulative layers and wiring layers and covers the first surface of the core substrate and the first conductive film. A second wiring portion includes alternately stacked insulative layers and wiring layers, and covers the second surface of the core substrate and the second conductive film.

14 Claims, 10 Drawing Sheets

(51) Int. Cl.
*H01L 23/538* (2006.01)
*H05K 1/18* (2006.01)
*H01L 23/31* (2006.01)
*H01L 23/13* (2006.01)
*H05K 3/46* (2006.01)

(52) U.S. Cl.
CPC .............. *H01L 24/24* (2013.01); *H01L 24/25* (2013.01); *H01L 24/82* (2013.01); *H05K 1/188* (2013.01); *H01L 23/13* (2013.01); *H01L 23/3128* (2013.01); *H01L 2224/24101* (2013.01); *H01L 2224/24155* (2013.01); *H01L 2224/821* (2013.01); *H01L 2224/82005* (2013.01); *H01L 2924/12042* (2013.01); *H01L 2924/1531* (2013.01); *H01L 2924/171* (2013.01); *H05K 3/4644* (2013.01); *H05K 3/4697* (2013.01); *H05K 2201/10636* (2013.01); *H05K 2203/1461* (2013.01); *Y02P 70/611* (2015.11)

(58) Field of Classification Search
CPC .............. H01L 24/18; H01L 2224/821; H01L 2924/1531; H01L 23/49822; H01L 24/24; H01L 24/25

USPC ........................................................ 257/774
See application file for complete search history.

(56) References Cited

U.S. PATENT DOCUMENTS

| | | | |
|---|---|---|---|
| 2006/0218782 A1* | 10/2006 | Tuominen ........... | H01L 23/5389 29/840 |
| 2006/0291173 A1 | 12/2006 | Cho et al. | |
| 2007/0076392 A1* | 4/2007 | Urashima ................ | H01G 2/06 361/763 |
| 2008/0055872 A1* | 3/2008 | Inagaki .................. | H01G 4/224 361/760 |
| 2008/0316714 A1* | 12/2008 | Eichelberger et al. ....... | 361/728 |
| 2009/0244865 A1* | 10/2009 | Tanaka ........................... | 361/764 |
| 2009/0249618 A1 | 10/2009 | Wang et al. | |
| 2010/0043942 A1* | 2/2010 | Tanaka et al. ................... | 156/64 |
| 2011/0240354 A1 | 10/2011 | Furuhata et al. | |
| 2011/0291293 A1* | 12/2011 | Tuominen ........... | H05K 1/0271 257/774 |

FOREIGN PATENT DOCUMENTS

| JP | 2007-258541 | 10/2007 |
|---|---|---|
| JP | 2011-216740 | 10/2011 |

* cited by examiner

WIRING SUBSTRATE AND METHOD FOR MANUFACTURING WIRING SUBTRATE

CROSS-REFERENCE TO RELATED APPLICATIONS

This application is based upon and claims the benefit of priority from prior Japanese Patent Application No. 2012-100926, filed on Apr. 26, 2012, the entire contents of which are incorporated herein by reference.

FIELD

This disclosure relates to a wiring substrate and a method for manufacturing a wiring substrate.

BACKGROUND

Japanese Laid-open Patent Publication No. 2007-258541 describes a wiring substrate including an electronic component such as a semiconductor chip. The wiring substrate includes a planar core and build-up layers formed on upper and lower surfaces of the core. A through hole extends through the core. An electronic component is arranged in the through hole. The through hole is filled with an insulator such as a resin. A via formed in each build-up layer electrically connects the electronic component to a wire in the build-up layer.

When manufacturing the wiring substrate, heat is applied to the core, the insulator filled in the through hole of the core, and the electronic component arranged in the through hole of the core. However, each of these members has a different coefficient of thermal expansion. This may deform the build-up layers. Such deformation of the build-up layers may lead to defects such as cracking or defoliation of the build-up layers or wire breakage.

SUMMARY

One aspect of the present invention is a wiring substrate provided with a core substrate including a first surface, a second surface opposite to the first surface, and an opening extending through the core substrate between the first surface and the second surface. A first conductive film is formed on the first surface. The first conductive film covers the opening. A second conductive film is formed on the second surface. The second conductive film covers the opening. An electronic component is arranged in the opening. The electronic component is connected to the first conductive film. An insulator fills the opening. A first wiring portion includes alternately stacked insulative layers and wiring layers. The first wiring portion covers the first surface of the core substrate and the first conductive film. A second wiring portion includes alternately stacked insulative layers and wiring layers. The second wiring portion covers the second surface of the core substrate and the second conductive film.

Other aspects and advantages of the present invention will become apparent from the following description, taken in conjunction with the accompanying drawings, illustrating by way of example the principles of the invention.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale. In the drawings, like numerals are used for like elements throughout.

DESCRIPTION OF THE EMBODIMENTS

Various embodiments will now be described with reference to the drawings. To facilitate understanding of the cross-sectional structure of each member, insulative layers are illustrated without hatching lines in the cross-sectional views.

Figure 1A:
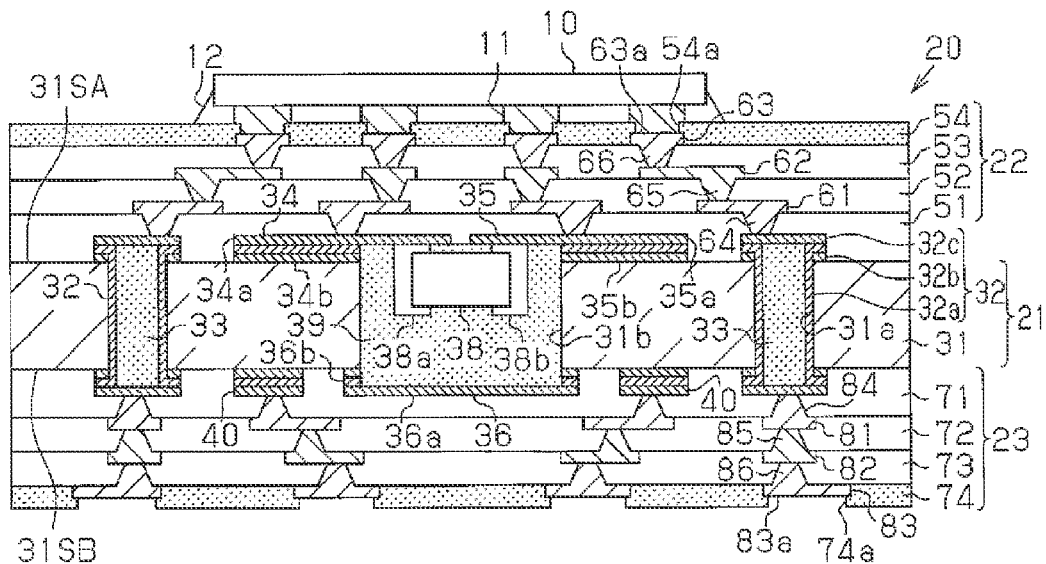
FIG. 1A is a schematic cross-sectional view of a wiring-substrate.

As illustrated in FIG. 1A, a semiconductor chip 10 is arranged on a first surface (upper surface as viewed in FIG. 1A) of a wiring substrate 20. The wiring substrate 20 is mounted on a substrate such as a motherboard (not illustrated). Further, the wiring substrate 20 may be used for the mounting of a chip such as a CPU. In such a case, the wiring substrate 20 is provided as a semiconductor package.

The wiring substrate 20 includes a core portion 21, a wiring portion 22 formed on an upper side of the core portion 21, and a wiring portion 23 formed on a lower side of the core portion 21.

The core portion 21 includes a core substrate 31, which has a first surface 31SA (upper surface as viewed in FIG. 1A) and a second surface 31SB (lower surface as viewed in FIG. 1A) opposite to the first surface 31SA. The core substrate 31 is a glass epoxy substrate formed by curing thermosetting insulative resin impregnated in, for example, a glass cloth (glass woven fabric) serving as a reinforcement member. The main component of the insulative resin is epoxy resin. The core substrate 31 may also be formed by impregnating resin, such as epoxy, in a woven fabric or non-woven fabric of glass or aramid.

Through holes 31a extend through the core substrate 31 between the first surface 31SA and the second surface 31SB at predetermined positions. A through member 32 extending through the core substrate 31 between the first and second surfaces 31SA and 31SB is formed in each through hole 31a. The through member 32 includes a tube 32a formed on the wall of the through hole 31a, an annular land 32b formed on each of the surfaces 31SA and 31SB of the core substrate 31, and a wire 32c that covers the lands 32b and closes the opening of the tube 32a. In FIG. 1A, for example, the land 32b is formed by two conductive layers. The interior of the through member 32 is filled with an insulator 33. The material of the through member 32 (tube 32a, land 32b, and wire 32c) may be, for example, copper (Cu). The insulator 33 is formed by filling resin into the tube 32a and then curing the resin. In other words, the resin of the insulator 33 has a viscosity that allows for the resin to be filled into the tube 32a prior to curing. The insulator 33 is formed from, for example, epoxy resin or a combination of epoxy resin and acrylic resin.

Figure 1B:
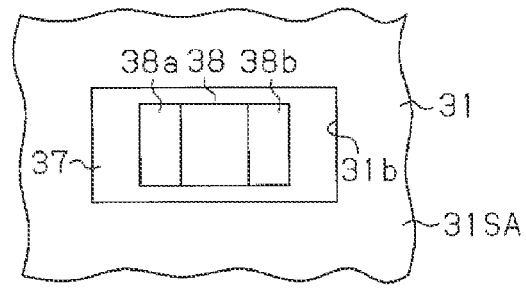
FIGS. 1B to 1D are plan views each illustrating a portion of the wiring substrate illustrated in FIG. 1A.

The core substrate 31 further includes an opening 31b that opens in the first surface 31SA and the second surface 31SB. That is, the opening 31b extends through the core substrate 31. As illustrated in FIG. 1B, the opening 31b is tetragonal as viewed from above. Two wires 34 and 35 formed on the first surface 31SA of the core substrate 31 substantially cover the opening 31b. The wires 34 and 35 each include a distal end facing the distal end of the other one of the wires 34 and 35. The distal end of the wire 34 and the distal end of the wire 35 are spaced apart by a distance of, for example, 30 to 150 μm. Each of the wires 34 and 35 is an example of a first conductive film. The wire 34 includes an electrode portion 34a and a connection portion 34b. The wire 35 includes an electrode portion 35a and a connection portion 35b. The material of the electrode portions 34a and 35a and the connection portions 34b and 35b may be, for example, copper.

Figure 1C:
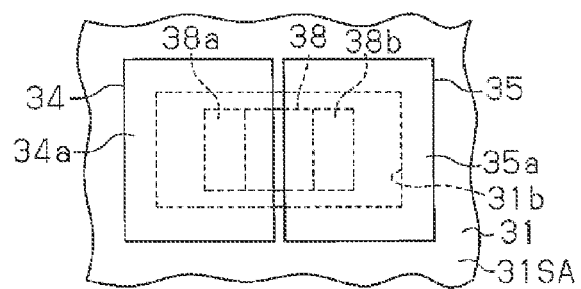

As illustrated in FIG. 1C, each of the electrode portions 34a and 35a includes a distal end facing the distal end of the other one of the electrode portions 34a and 35a at the central section of the opening 31b. The electrode portions 34a and 35a substantially cover the opening 31b. The electrode portions 34a and 35a are, for example, tetragonal. Each of the electrode portions 34a and 35a extends from the central section of the opening 31b to the first surface 31SA of the core substrate 31. As illustrated in FIG. 1A, the connection portion 34b connects the electrode portion 34a to the first surface 31SA of the core substrate 31. In the same manner, the connection portion 35b connects the electrode portion 35a to the first surface 31SA of the core substrate 31. As illustrated in FIG. 1A, the connection portions 34b and 35b are each formed by, for example, two conductive layers.

The opening 31b is further covered by a wire 36 formed on the second surface 31SB of the core substrate 31. The wire 36 is one example of a second conductive film. The wire 36 includes a covering portion 36a and a connection portion 36b. In the same manner as the wires 34 and 35, the material of the covering portion 36a and the connection portion 36b may be, for example, copper. The covering portion 36a is tetragonal and has a larger size than the opening 31b. Accordingly, the covering portion 36a covers the opening 31b. The connection portion 36b has the shape of a tetragonal frame to connect the entire rim of the covering portion 36a to the second surface 31SB of the core substrate 31. In FIG. 1A, the connection portion 36b is formed by, for example, two conductive layers.

Referring to FIG. 1B, the wall of the opening 31b in the core substrate 31, the wires 34 and 35 arranged on the first surface 31SA of the core substrate 31, and the wire 36 arranged on the second surface 31SB of the core substrate 31 define an accommodation portion 37. The accommodation portion 37 accommodates a chip capacitor 38, which is one example of an electronic component. The chip capacitor 38 includes a box-shaped capacitor body and two connection terminals 38a and 38b located on the two longitudinal ends of the chip capacitor 38. The connection terminal 38a is connected to the wire 34 (electrode portion 34a), and the connection terminal 38b is connected to the wire 35 (electrode portion 35a).

The interior of the accommodation portion 37 is filled with an insulator 39. The insulator 39 is formed from, for example, the same resin as the insulator 33 filled in the through member 32. Thus, the resin of the insulator 39 has a viscosity that allows for the resin to be filled into the accommodation portion 37 prior to curing. Further, the resin of the insulator 39 is filled into the accommodation portion 37 to cover the chip capacitor 38.

Wires 40 are formed on the second surface 31SB of the core substrate 31. The material of the wires 40 may be, for example, copper. The wires 40 are formed by, for example, a plurality of conductive layers (three conductive layers in FIG. 1A).

The wiring portion 22 formed on the first surface 31SA of the core portion 21 includes insulative layers 51 to 53 and wiring layers 61 to 63. The insulative layer 51, the wiring layer 61, the insulative layer 52, the wiring layer 62, the insulative layer 53, and the wiring layer 63 are stacked in this order on the first surface 31SA of the core portion 21. The material of the insulative layers 51 to 53 may be, for example, an epoxy insulative resin. The material of the wiring layers 61 to 63 may be, for example, copper.

Figure 1D:
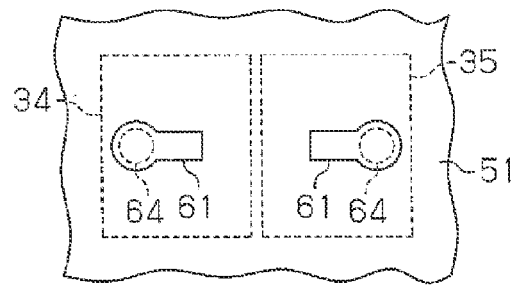

As illustrated in FIG. 1D, vias 64 extend through the insulative layer 51 and connect the wiring layer 61 to the wires 34 and 35 and the through members 32 (refer to FIG. 1A). In the same manner, vias 65, which extend through the insulative layer 52, connect the wiring layer 62 to the wiring layer 61. In the same manner, vias 66, which extend through the insulative layer 53, connect the wiring layer 63 to the wiring layer 62. A resist film 54 covers the outermost insulative layer 53 and the outermost wiring layer 63. The resist film 54 includes openings 54a at predetermined positions. The portions of the wiring layer 63 exposed from the openings 54a function as electrodes 63a connected to the semiconductor chip 10.

In the same manner, the wiring portion 23 formed on the second surface 31SB of the core portion 21 includes insulative layers 71 to 73 and wiring layers 81 to 83. The insulative layer 71, the wiring layer 81, the insulative layer 72, the wiring layer 82, the insulative layer 73, and the wiring layer 83 are stacked in this order on the second surface 31SB of the core portion 21. The material of the insulative layers 71 to 73 may be, for example, an epoxy insulative resin. Further, the material of the wiring layers 81 to 83 may be, for example, copper.

Vias 84 extend through the insulative layer 71 and connect the wiring layer 81 to the wires 40 and the through members 32. In the same manner, vias 85, which extend through the insulative layer 72, connect the wiring layer 82 to the wiring layer 81. In the same manner, vias 86, which extend through the insulative layer 73, connect the wiring layer 83 to the wiring layer 82, A resist film 74 covers the outermost insulative layer 73 and the outermost wiring layer 83. The resist film 74 includes openings 74a at predetermined positions. The portions of the wiring layer 83 exposed from the openings 74a function as external connection pads 83a.

The semiconductor chip 10 includes bumps 11 connected to the electrode 63a. A gap formed between the semiconductor chip 10 and the wiring substrate 20 is filled with an underfill resin 12, The underfill resin 12 increases the connection strength of the electrodes 63a and the bumps 11, The material of the underfill resin 12 may be, for example, epoxy resin. Although not illustrated in the drawings, the external connection pads 83a are connected to pads of a mounted substrate by bumps (solder balls or the like).

The operation of the wiring substrate 20 will now be described.

In the wiring substrate 20, the chip capacitor 38 is arranged in the opening 31b and covered by the insulator 39. The wires 34 and 35, arranged on the first surface 31SA of the core substrate 31, substantially cover the insulator 39.

Further, the wire 36, arranged on the second surface 31SB of the core substrate 31, covers the insulator 39. Accordingly, in the same manner as the insulator 33 filled in each through member 32, the insulator 39 is covered by the wires 34 to 36, which are metal films. The core substrate 31 may have a coefficient of thermal expansion (CTE) that differs from the CTE of the insulator 39. Even in such a case, the wires 34 to 36 reduce the effect that the difference in the coefficients of thermal expansion between the core substrate 31 and the insulator 39 has on the wiring portions 22 and 23. This suppresses the formation of cracks in the core substrate 31 and the wiring portions 22 and 23 and suppresses defoliation of the wiring portions 22 and 23.

A method for manufacturing the wiring substrate 20 will now be described.

Figure 2A:
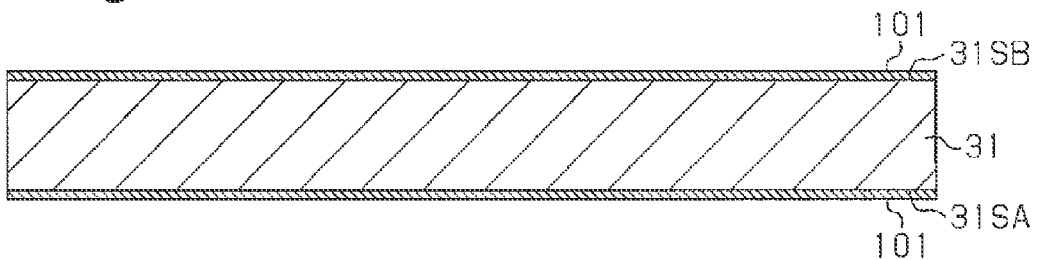
FIGS. 2A to 2E, 3A to 3E, and 4A to 4D are schematic cross-sectional views of a method for manufacturing the wiring substrate of FIG. 1A.
Figure 2B:
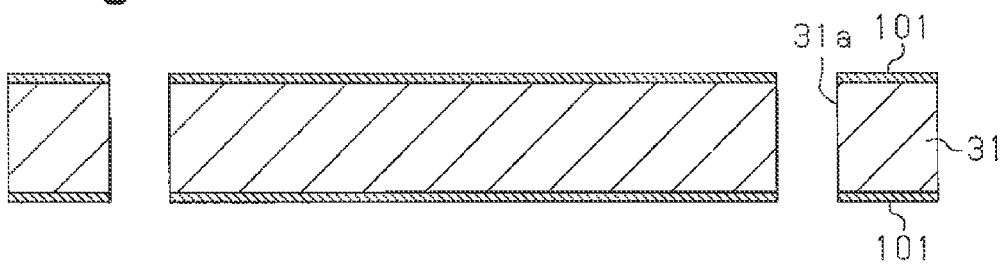
Figure 2C:
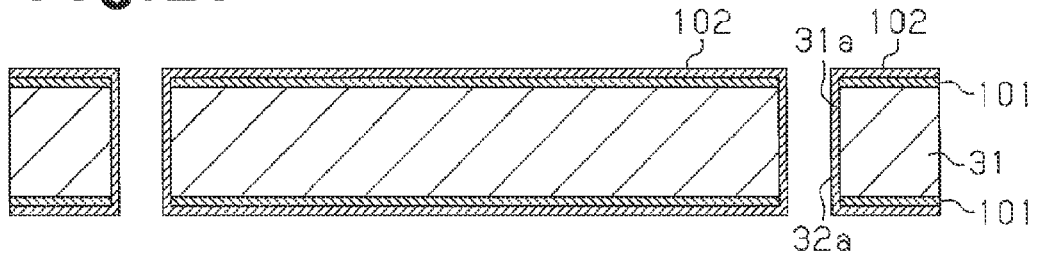
Figure 2D:
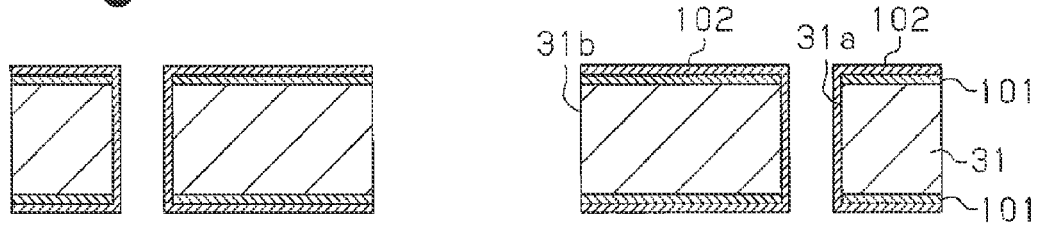
Figure 2E:
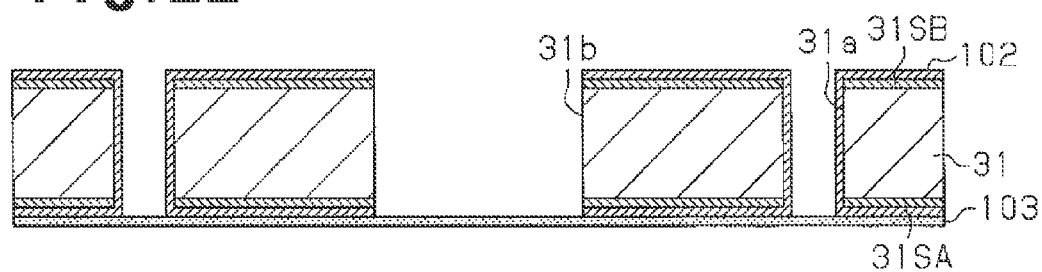

Referring to FIG. 2A, the core substrate 31 is first prepared. The core substrate 31 includes a conductive layer 101 on each of the first and second surfaces 31SA and 31SB. The conductive layer 101 may be, for example, a foil of copper (Cu). Then, referring to FIG. 2B, the through holes 31a are formed in the core substrate 31. For example, a laser processing machine or a drilling machine may be used to form the through holes 31a. For example, when forming the through holes 31a with a laser processing machine, a desmear process is performed to remove residual resin smears or the like from the through holes 31a. The desmear process may use, for example, potassium permanganate. Then, referring to FIG. 2C, the tubes 32a are formed on the walls of the through holes 31a, and a conductive layer 102 is formed on the conductive layers 101. The tubes 32a and the conductive layer 102 may be formed by, for example, performing electroless copper plating and electrolytic copper plating in this order. Then, referring to FIG. 2D, the opening 31b is formed in the core substrate 31. For example, a punching press, a drilling machine, or a router machine may be used to form the opening 31b. Then, referring to FIG. 2E, an adhesive film 103 is applied to the conductive layer 102 (lower conductive layer 102 as viewed in FIG. 2E) that is formed on the first surface 31SA of the core substrate 31.

Figure 3A:
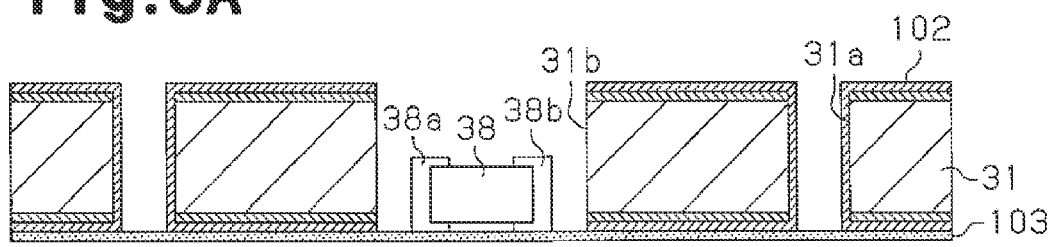
Figure 3B:
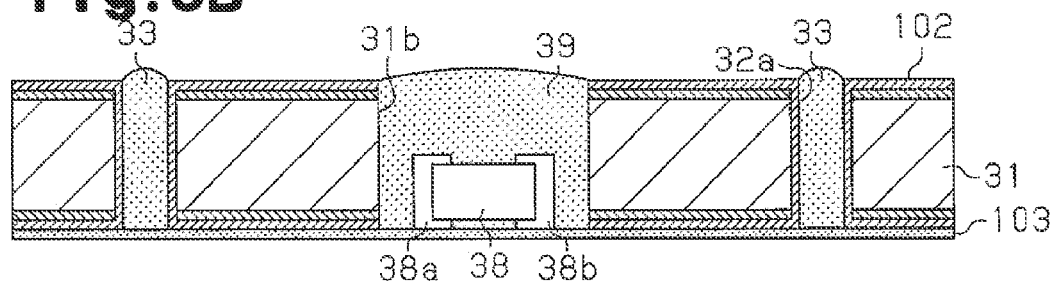
Figure 3C:
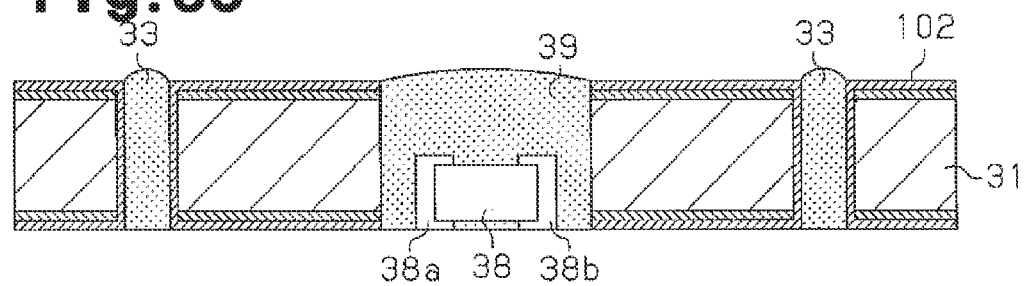
Figure 3D:
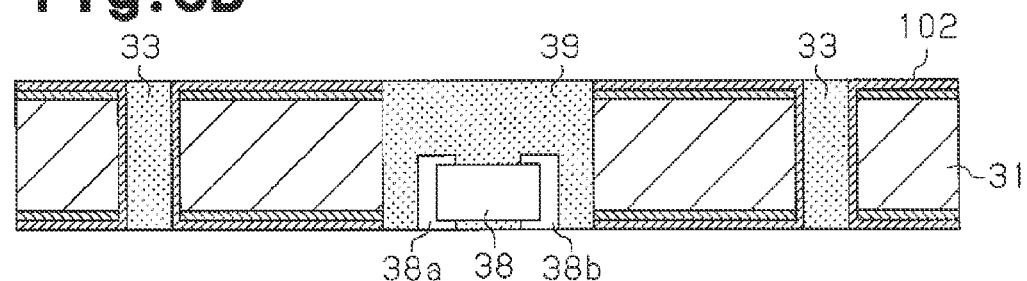
Figure 3E:
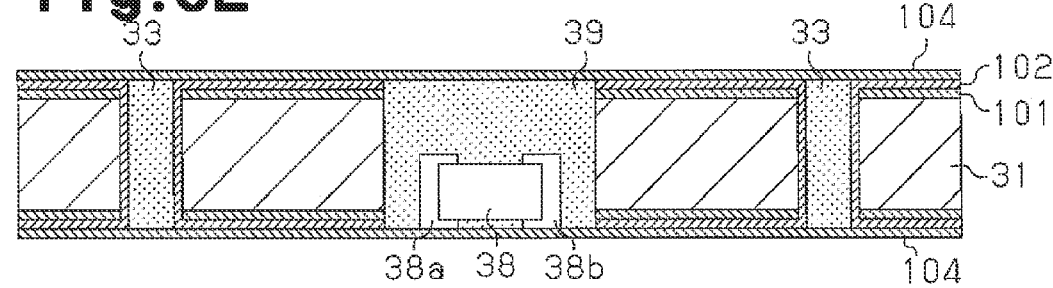

Then, referring to FIG. 3A, a mounter is used to mount the chip capacitor 38 on the adhesive film 103 in the opening 31b of the core substrate 31. Then, referring to FIG. 3B, the insulator 33 is filled into each tube 32a and the insulator 39 is filled into the opening 31b. The material of the insulators 33 and 39 may be, for example, epoxy resin or a combination of an acrylic resin and an epoxy resin. For example, printing may be performed with a mask screen and a squeegee under a depressurized condition (e.g., vacuum atmosphere) to fill the insulators 33 and 39 into the tubes 32a and the opening 31b. In this manner, by simultaneously filling the insulators 33 and 39 into the tubes 32a and the opening 31b, the number of steps is reduced as compared with filling the insulators 33 and 39 in separate steps. This allows for reduction in the manufacturing time of the wiring substrate 20. Then, referring to FIG. 3C, the adhesive film 103 is removed. This exposes the connection terminals 38a and 38b that were adhered to the adhesive film 10 3. Then, referring to FIG. 3D, the surfaces (upper surfaces as viewed in FIG. 3D) of the insulators 33 and 39 are grinded until becoming generally flush with the surface (upper surface as viewed in FIG. 3D) of the conductive layer 102. Buffing or blasting may be performed to grind the insulators 33 and 39. Then, a desmear process is performed to remove residues from the surface. Referring to FIG. 3E, a conductive layer 104 is formed on each of the conductive layers 102. The conductive layer 104 may be formed by, for example, performing electroless copper plating and electrolytic copper plating in this order. The conductive layer 104 covers the insulators 33 and 39 and the conductive layer 102. Further, the conductive layer 104 also covers the surfaces of the connection terminals 38a and 38b of the chip capacitor 38. Accordingly, the conductive layer 104 is connected to the connection terminals 38a and 38b.

Figure 4A:
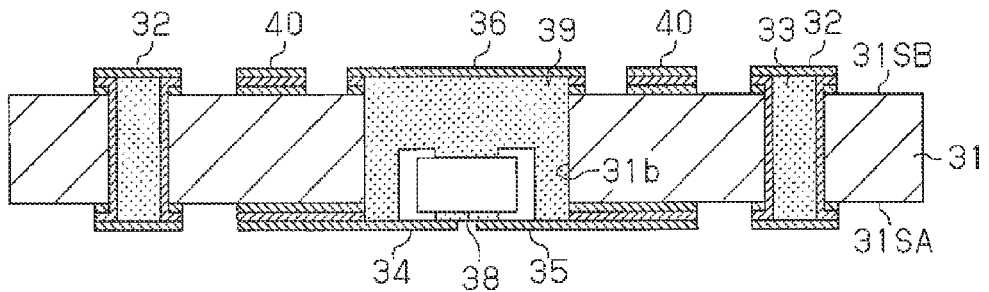
Figure 4B:
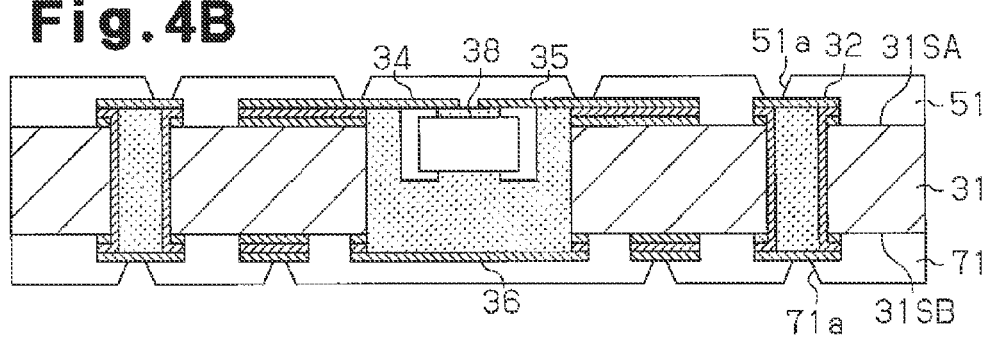
Figure 4C:
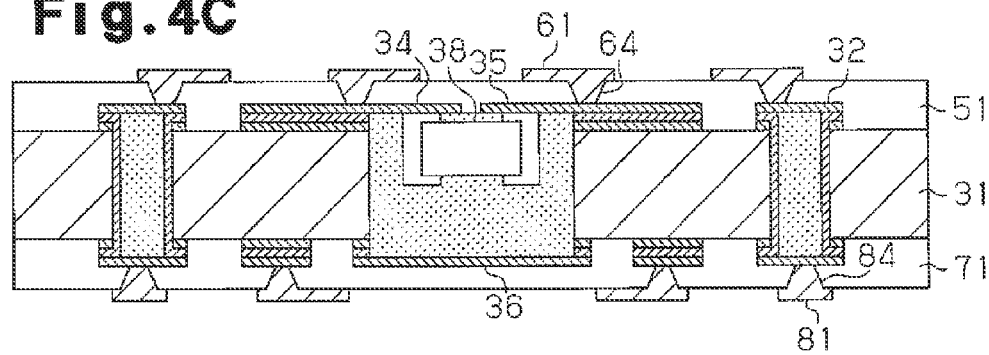
Figure 4D:
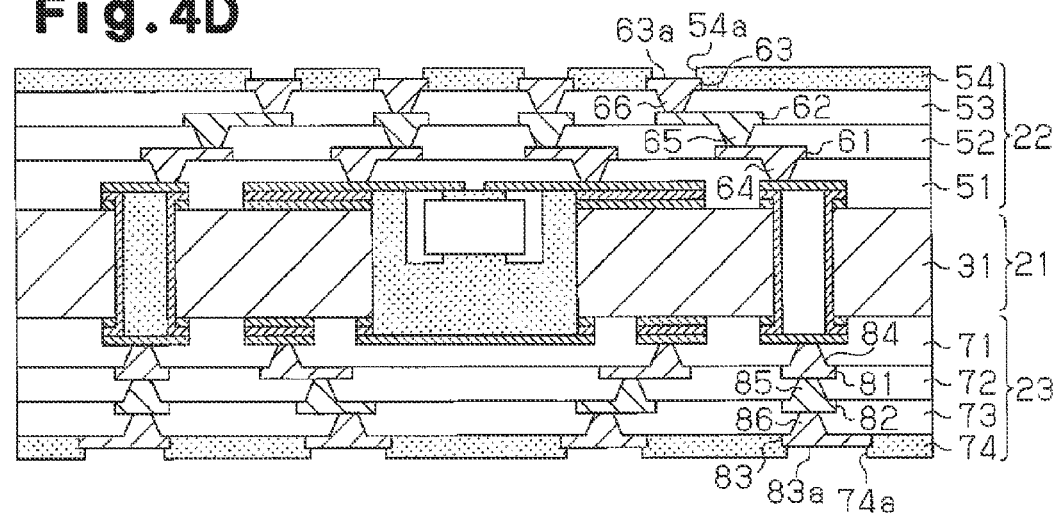

Then, referring to FIG. 4A, the conductive layers 101, 102, and 104 are etched and patterned into a predetermined shape to form the wires 34, 35, 36, and the like. For example, a subtractive process may be performed to form the wires 34 to 36. The wires 34 to 36 substantially close the opening 31b filled with the insulator 39. Then, referring to FIG. 4B, the insulative layers 51 and 71 are formed, and the openings 51a and 71a are formed in the insulative layers 51 and 71. In the steps from FIG. 4B, the structure illustrated in FIG. 4A is reversed upside down. For example, a laser-processing machine may be used to form the openings 51a and 71a. Then, a desmear process is performed to remove resin smears or the like produced by the laser processing. Then, referring to FIG. 4C, the vias 64 and 84 and the wiring layers 61 and 81 are formed. The vias 64 and 84 and the wiring layers 61 and 81 may be formed, for example, by-undergoing electroless copper plating and electrolytic copper plating during a semi-additive process. In the same manner, as illustrated in FIG. 4D, the insulative layers 52 and 72, the vias 65 and 85, the wiring layers 62 and 82, the insulative layers 53 and 73, the vias 66 and 86, and the wiring layers 63 and 83 are formed. The wiring portions 22 and 23 are formed in this manner. Then, the resist film 54 is formed on the insulative layer 53 and the wiring layer 63. Further, the openings 54a are formed in the resist film 54 to expose portions of the wiring layer 63 as the electrodes 63a. In the same manner, the resist film 74 is formed on the insulative layer 73 and the wiring layer 83. The openings 74a are formed in the resist film 74 to expose portions of the wiring layer 83 as the external connection pads 83a. The resist films 54 and 74 may be formed, by, for example, laminating a solder resist film of a photosensitive resin, such as an epoxy resin, and patterning the resist film into a predetermined shape.

The first embodiment has the advantages described below.

(1) The core substrate 31 includes the opening 31b that accommodates the chip capacitor 38, which is embedded in the insulator 39 inside the opening 31b. The insulator 39 is substantially covered by the wires 34 and 35 formed on the first surface 31SA of the core substrate 31. Further, the insulator 39 is covered by the wire 36 formed on the second surface 31SB of the core substrate 31. Thus, the insulator 39 is covered by metal films. This reduces the effect that the difference in the coefficients of thermal expansion between the insulator 39 and the core substrate 31 has on the wiring portions 22 and 23. Thus, the formation of cracks in the core substrate 31 and the wiring portions 22 and 23 is suppressed, and defoliation of the wiring portions 22 and 23 is suppressed.

(2) The insulator 39 filled in the opening 31b and the insulator 33 filled in the tube 32a of each through member 32 are formed from the same material. Accordingly, the insulators 39 and 33 may respectively be filled in the opening 31b and the tubes 32a during the same step. This reduces the number of steps compared to when the insulators 33 and the insulator 39 are filled in the tubes 32a and the opening 31b in separate steps. This allows for reduction in the manufacturing time of the wiring substrate 20.

A wiring substrate 20a of a second embodiment will now be described.

Figure 5:
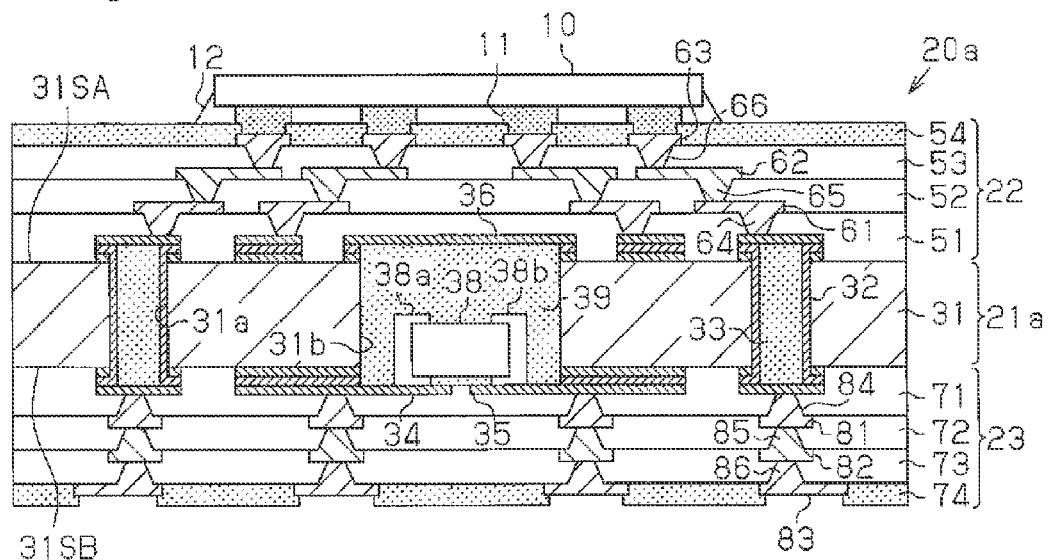
FIG. 5 is a schematic cross-sectional view of a further wiring substrate.

As illustrated in FIG. 5, the wiring substrate 20a includes a core portion 21a, and the core portion 21a includes a core substrate 31. An opening 31b is formed in the core substrate 31. A wire 36, formed on a first surface 31SA (upper surface as viewed in FIG. 5) of the core substrate 31, covers the opening 31b. Further, two wires 34 and 35, formed on a second surface 31SB (lower surface as viewed in FIG. 5) of the core substrate 31, covers the opening 31b. The wall of the opening 31b, the wire 36 arranged on the first surface 31SA of the core substrate 31, and the wires 34 and 35 arranged on the second surface 31SB define an accommodation portion 37. The accommodation portion 37 accommodates a chip capacitor 38, which is one example of an electronic component. The chip capacitor 38 includes connection terminals 38a and 38b respectively connected to the wires 34 and 35 arranged on the second surface 31SB of the core substrate 31. The accommodation portion 37 is filled with an insulator 39.

In the wiring substrate 20a, the upper surface of the insulator 39 is covered by the wire 36, and the lower surface of the insulator 39 is covered by the wires 34 and 35. The chip capacitor 38 is embedded in the insulator 39. In the same manner as the wiring substrate 20 of the first embodiment, in the second embodiment, the wires 34, 35, and 36 reduce the effect that the difference in the coefficients of thermal expansion between the core substrate 31 and the insulator 39 has on the wiring portions 22 and 23. Thus, the formation of cracks in the core substrate 31 and the wiring portions 22 and 23 is suppressed, and defoliation of the wiring portions 22 and 23 is suppressed.

A wiring substrate 20b of a third embodiment will now be described.

Figure 6:
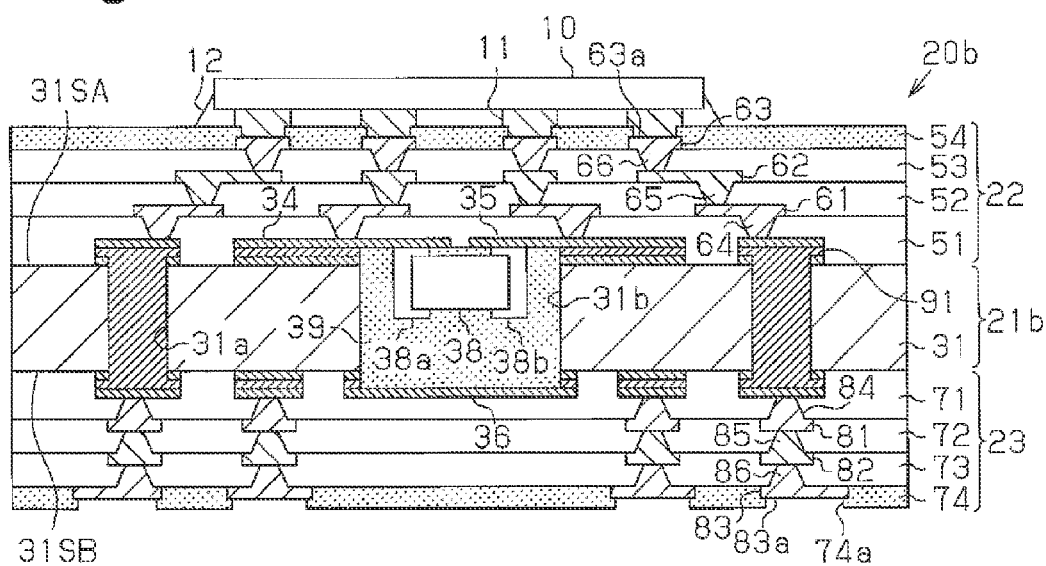
FIG. 6 is a schematic cross-sectional view of another wiring substrate.

As illustrated in FIG. 6, the wiring substrate 20b includes a core portion 21b, and the core portion 21b includes a core substrate 31. Through holes 31a extend through the core substrate 31 between the first surface 31SA and the second surface 31SB at predetermined positions. A through member 91 extending through the core substrate 31 between the first and second surfaces 31SA and 31SB is formed in each through hole 31a. The through member 91 is a so-called filled via having an interior filled with a conductive body (e.g., copper). The through members 91 are shaped in conformance with the through holes 31a and may be, for example, cylindrical.

A method for manufacturing the wiring substrate 20b will now be described.

Figure 7A:
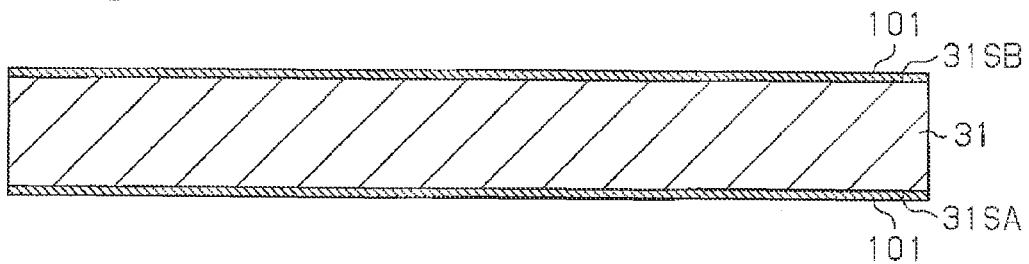
FIGS. 7A to 7E, 8A to 8E, and 9A to 9D are schematic cross-sectional views of a method for manufacturing the wire substrate of FIG. 6.
Figure 7B:
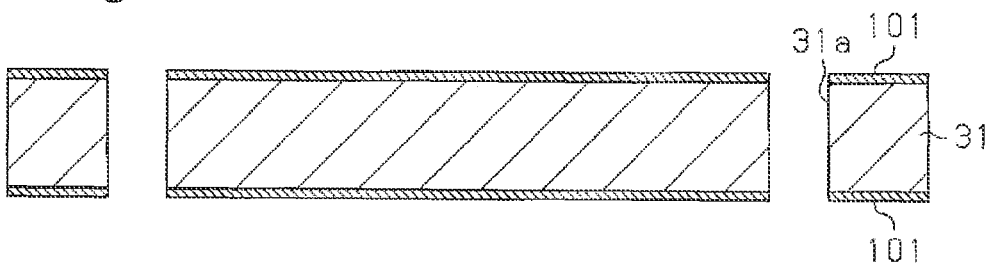
Figure 7C:
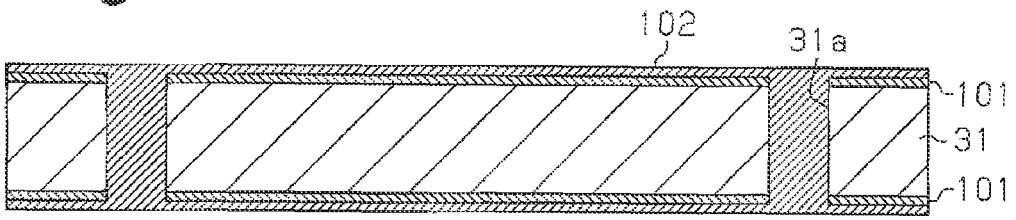
Figure 7D:
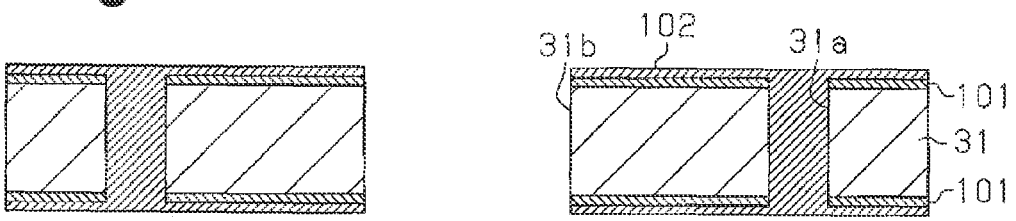

Referring to FIG. 7A, the core substrate 31 is first prepared. The core substrate 31 includes a conductive layer 101 on each of the first and second surfaces 31SA and 31SB. The conductive layer 101 may be, for example, a copper (Cu) foil. Then, referring to FIG. 7B, the through holes 31a are formed in the core substrate 31. For example, a laser processing machine or a drilling machine may be used to form the through holes 31a. For example, when forming the through holes 31a with a laser processing machine, a desmear process is performed to remove residual resin smears or the like from the through holes 31a. The desmear process may use, for example, potassium permanganate. Then, referring to FIG. 7C, a conductive layer 102 is formed. The conductive layer 102 may be formed by, for example, performing electroless copper plating and electrolytic copper plating in this order. For example, electroless copper plating is performed to form a seed layer on the wall of each through hole 31a, and electrolytic copper plating is performed using the seed layer as an electrode to fill the through hole 31a with the conductive layer 102. Then, referring to FIG. 7D, the opening 31b is formed in the core substrate 31.

Figure 7E:
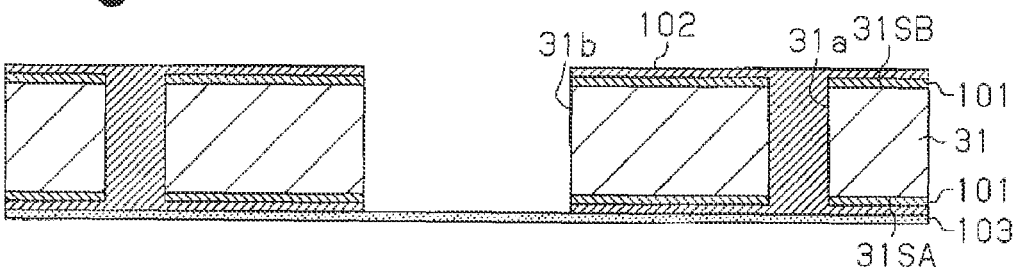

For example, a punching press, a drilling machine, or a router machine may be used to form the opening 31b. Then, referring to FIG. 7E, an adhesive film 103 is applied to the conductive layer 102 (lower conductive layer 102 as viewed in FIG. 2E) that is formed on the first surface 31SA of the core substrate 31.

Figure 8A:
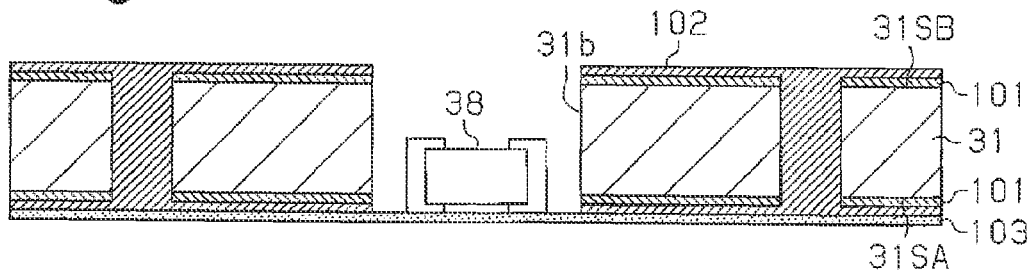
Figure 8B:
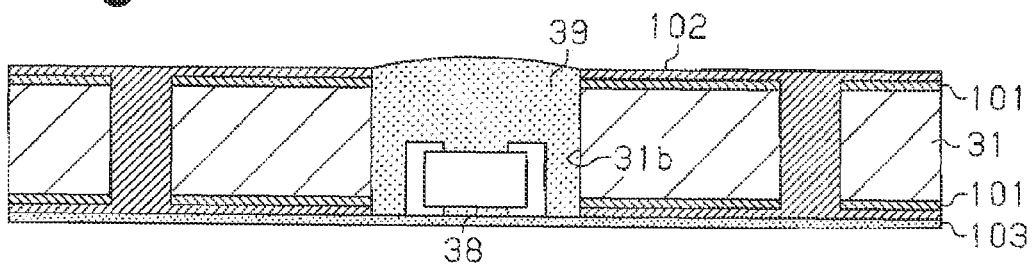
Figure 8C:
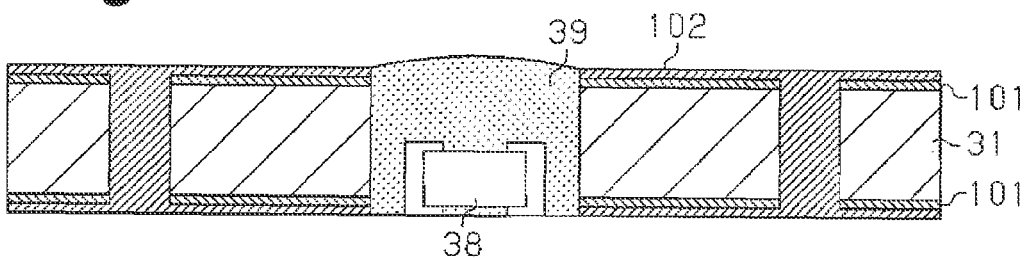
Figure 8D:
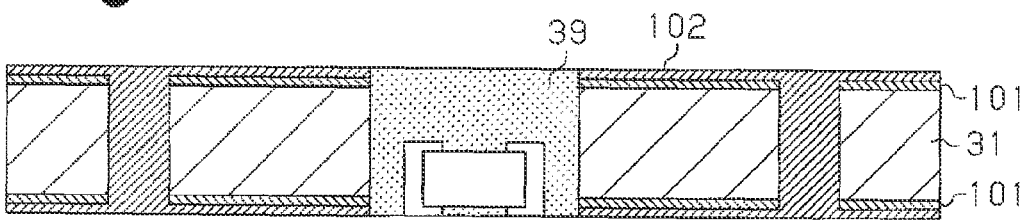
Figure 8E:
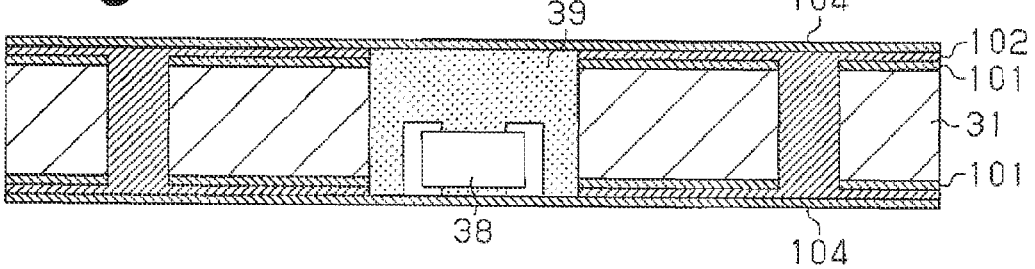

Then, referring to FIG. 8A, a mounter is used to mount the chip capacitor 38 on the adhesive film 103 in the opening 31b of the core substrate 31. Then, referring to FIG. 8B, the insulator 39 is filled into the opening 31b. The material of the insulator 39 may be, for example, epoxy resin or a combination of an acrylic resin and an epoxy resin. For example, printing, which uses a mask screen and a squeegee, or film filling may be performed under a depressurized condition (e.g., vacuum atmosphere) to fill the insulator 39 into the opening 31b. A semi-cured insulative resin sheet may be stacked on the conductive layer 102 to close the opening 31b, and the insulative resin sheet may be heated and pressurized under a depressurized condition (e.g., vacuum atmosphere) to fill and cure the insulator 39 in the opening 31b. Then, referring to FIG. 8C, the adhesive film 103 is removed. Then, referring to FIG. 8D, the surface of the insulator 39 is grinded until becoming generally flush with the surface of the conductive layer 102. Buffing or blasting may be performed to grind the insulator 39. Then, a desmear process is performed to remove residues from the surface. Referring to FIG. 8E, a conductive layer 104 is formed on each of the conductive layers 102. The conductive layer 104 may be formed by, for example, performing electroless copper plating and electrolytic copper plating in this order. The conductive layer 104 covers the insulator 39 and the conductive layer 102.

Figure 9A:
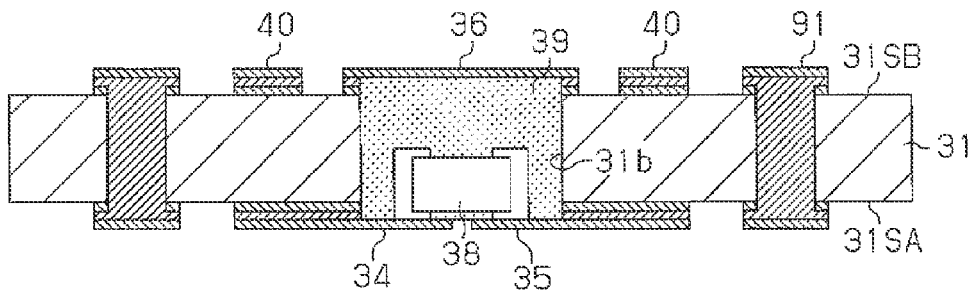
Figure 9B:
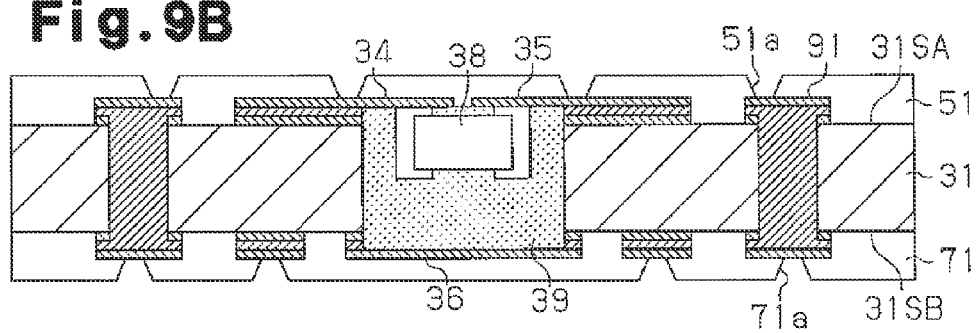
Figure 9C:
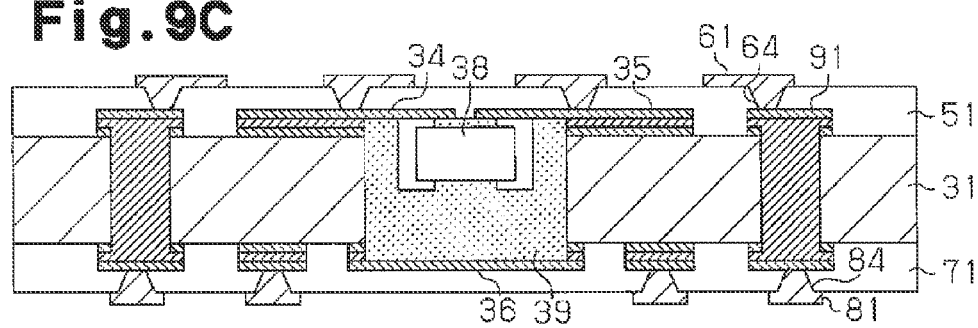
Figure 9D:
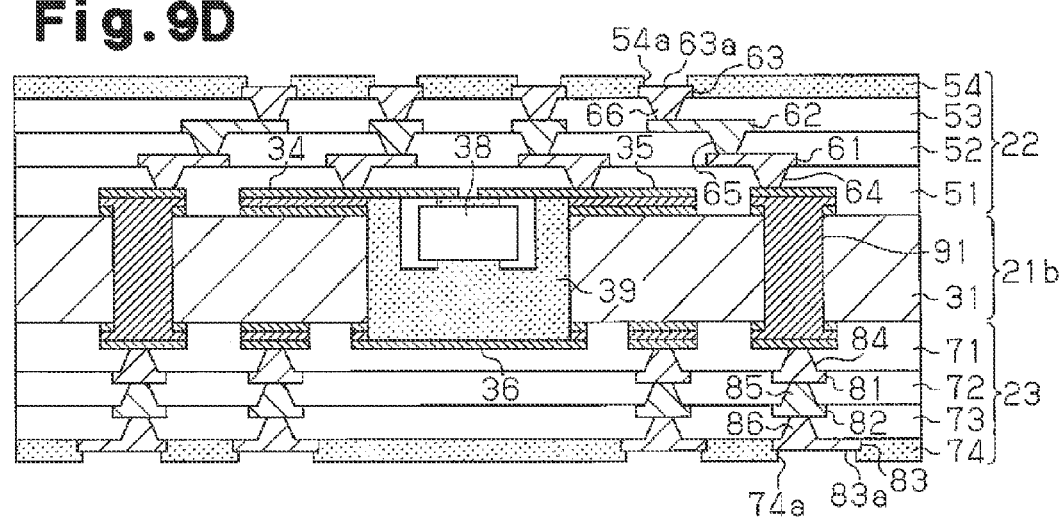

Then, referring to FIG. 9A, the conductive layers 101, 102, and 104 are etched and patterned into a predetermined shape to form the wires 34, 35, 36, and the like. For example, a subtractive process may be performed to form the wires 34 to 36, Then, referring to FIG. 9B, the insulative layers 51 and 71 are formed, and the openings 51a and 71a are formed in the insulative layers 51 and 71. In the steps from FIG. 9B, the structure illustrated in FIG. 9A is reversed upside down. For example, a laser processing machine may be used to form the openings 51a and 71a. Then, a desmear process is performed to remove resin smears or the like produced by the laser processing. Then, referring to FIG. 9C, the vias 64 and 84 and the wiring layers 61 and 81 are formed. The vias 64 and 84 and the wiring layers 61 and 81 may be formed, for example, by undergoing electroless copper plating and electrolytic copper plating during a semi-additive process. In the same manner, as illustrated in FIG. 9D, the insulative layers 52 and 72, the vias 65 and 85, the wiring layers 62 and 82, the insulative layers 53 and 73, the vias 66 and 86, and the wiring layers 63 and 83 are formed. The wiring portions 22 and 23 are formed in this manner. Then, the resist film 54 is formed on the insulative layer 53 and the wiring layer 63. Further, the openings 54a are formed in the resist film 54 to expose portions of the wiring layer 63 as the electrodes 63a. In the same manner, the resist film 74 is formed on the insulative layer 73 and the wiring layer 83. The openings 74a are formed, in the resist film. 74 to expose portions of the wiring layer 83 as the external connection pads 83a. The resist films 54 and 74 may be formed by, for example, laminating a solder resist film of a photosensitive resin, such as an epoxy resin, and patterning the resist film into a predetermined shape.

Like the wiring substrate illustrated in FIG. 5, in the third embodiment, one wire 36 may be formed on the first surface 31SA of the core substrate 31, and two wires 34 and 35 may be formed on the second surface 31SB of the core substrate 31. Then, the chip capacitor 38 may be arranged in the opening 31b of the core substrate 31, and the connection terminals 38a and 38b of the chip capacitor 38 may be electrically connected to the wires 34 and 35.

In addition to the advantages of the first embodiment, the third embodiment has the advantages described below.

(3) The through members 91 extending between the first and second surfaces 31SA and 31SB of the core substrate 31 are formed by filling the through holes 31a of the core substrate 31 with plating. Accordingly, the material of the insulator 39 that fills the opening 31b of the core substrate 31 may be selected without being influenced by the material of the through members 91. For example, a resin having a coefficient of thermal expansion close to that of the core substrate 31 may be used as the material of the insulator 39. This effectively suppresses the formation of cracks in the core substrate 31 and the wiring portions 22 and 23 and suppresses defoliation of the wiring portions 22 and 23.

It should be apparent to those skilled in the art that the present invention may be embodied in many other specific forms without departing from the spirit or scope of the invention. Particularly, it should be understood that the present invention may be embodied in the following forms.

In the above embodiments, the number of layers in the wiring portions 22 and 23 may be changed.

In the wiring substrates 20, 20a, and 20b, the opening 31b (accommodation portion 37) of the core substrate 31 accommodates the chip capacitor 38. Instead of the chip capacitor 38, an electronic component such as a chip resistor, an inductor, and a semiconductor device (LSI) may be accommodated.

The accommodation portion 37 accommodates the chip capacitor 38 that includes the two connection terminals 38a and 38b. Instead, the accommodation portion 37 may accommodate an electronic component such as a capacitor including three or more terminals.

A wiring substrate may include cavities (openings, i.e., accommodation portions) to accommodate electronic components. Further, the number of electronic components accommodated in a single cavity is not limited to one, and a plurality of electronic components may be accommodated in a single cavity. Moreover, the electronic components mounted on a wiring substrate are not limited to one type and may be more than one type.

Figure 10A:
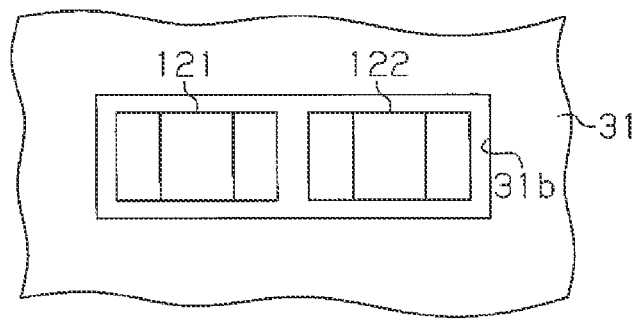
FIGS. 10A to 10C are plan views each illustrating a portion of a further wiring substrate.
Figure 10B:
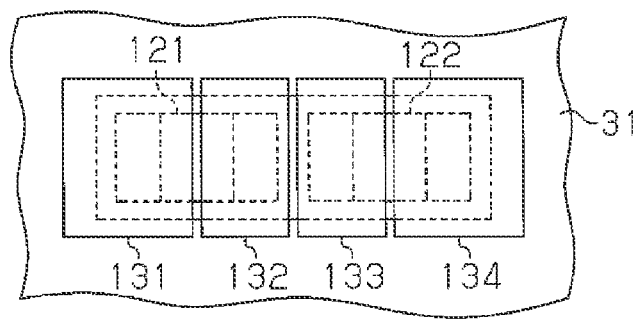
Figure 10C:
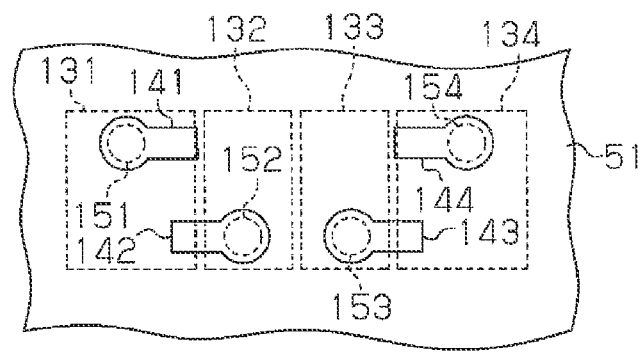

For example, as illustrated in FIG. 10A, two capacitors 121 and 122 are arranged in the opening 31b of the core substrate 31. Although not illustrated in the drawing, the chip capacitors 121 and 122 are embedded in the insulator 39 (refer to FIG. 1A) filling the opening 31b. As illustrated in FIG. 10B, wires 131, 132, 133, and 134 are arranged in correspondence with the electrodes of the chip capacitors 121 and 122 to substantially cover the opening 31b including the chip capacitors 121 and 122. Further, as illustrated in FIG. 10C, vias 151 to 154 extend through the insulative layer 51 to electrically connect the wires 131 to 134 to wiring layers 141 to 144 formed on the upper surface of the insulative layer 51 that covers the wires 131 to 134.

Figure 11A:
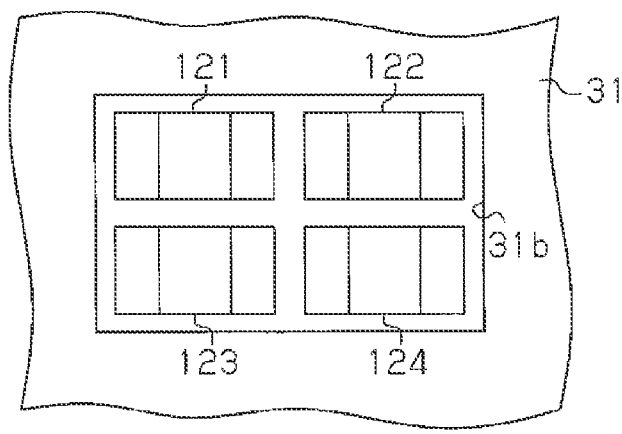
FIGS. 11A to 11C are plain views each illustrating a portion of another wiring substrate.
Figure 11B:
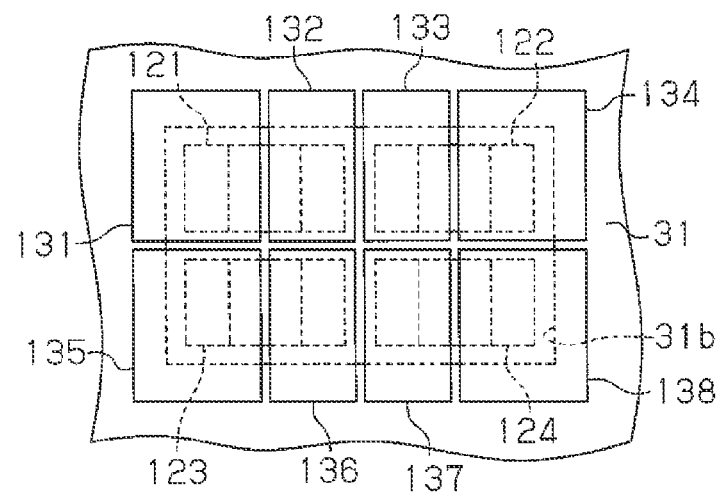
Figure 11C:
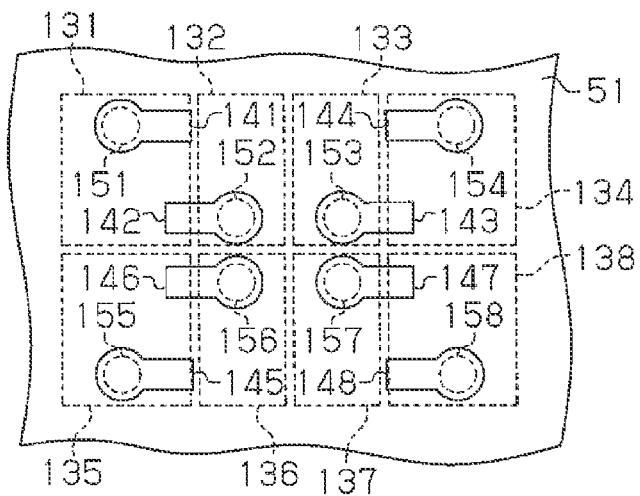

In a further example, as illustrated in FIG. 11A, four chip capacitors 121, 122, 123, and 124 are arranged in the opening 31b of the core substrate 31. Although not illustrated in the drawings, the chip capacitors 121 to 124 are embedded in the insulator 39 (refer to FIG. 1A) filling the opening 31b. As illustrated in FIG. 11B, wires 131 to 138 are arranged in correspondence with the electrodes of the chip capacitors 121 and 124 to substantially cover the opening 31b including the chip capacitors 121 to 124. Further, as illustrated in FIG. 11C, vias 151 to 158 extend through the insulative layer 51 to electrically connect the wires 131 to 138 to wiring layers 141 to 148 formed on the upper surface of the insulative layer 51 that covers the wires 131 to 134.

The direction in which the chip capacitors are arranged may be changed. For example, in FIG. 11A, the two chip capacitors 121 and 122 are arranged so that the four electrodes are arranged along a straight line (lateral direction as viewed in FIG. 11A). However, the chip capacitors 121 and 122 may be rotated by 90 degrees from the positions illustrated in FIG. 11A.

The present examples and embodiments are to be considered as illustrative and not restrictive, and the invention is not to be limited to the details given herein, but may be modified within the scope and equivalence of the appended claims.

The invention claimed is:

1. A wiring substrate comprising:
a core substrate including an upper surface, a lower surface, and an opening extending through the core substrate between the upper surface and the lower surface;
a first conductive film formed on the upper surface of the core substrate, wherein the first conductive film consists of at least two, spaced apart wires that are located coplanar with each other and cover the opening;
a second conductive film formed on the lower surface of the core substrate, wherein the second conductive film covers the opening;
an electronic component arranged in the opening, wherein the electronic component includes connection terminals that are connected to the first conductive film;
an insulator filling the opening, wherein the insulator includes an upper surface, which is located at a higher level than the upper surface of the core substrate, and a lower surface, which is located at a lower level than the lower surface of the core substrate;
a first wiring portion including an insulative layer and a wiring layer, wherein the first wiring portion covers the upper surface of the core substrate and the first conductive film; and
a second wiring portion including an insulative layer and a wiring layer, wherein the second wiring portion covers the lower surface of the core substrate and the second conductive film, wherein
each of the connection terminals of the electronic component includes an upper edge surface that is flush with the upper surface of the insulator,
each of the at least two, spaced apart wires is formed in a planar shape on the upper surface of the core substrate, the upper edge surface of each connection terminal, and the upper surface of the insulator,
each of the at least two, spaced apart wires of the first conductive film includes a first layer and a second layer, wherein:
the first layer of each of the at least two, spaced apart wires forms an electrode portion, wherein the first layer that forms the electrode portion extends horizontally and covers from a portion of the insulator between the connection terminals, which is located at a central section of the opening, to the upper surface of the core substrate and the first layer that forms the electrode portion is arranged on and entirely covers the upper edge surface of each connection terminal exposed from the insulator; and
the second layer of each of the at least two, spaced apart wires forms a connection portion sandwiched between the first layer that forms the electrode portion and the upper surface of the core substrate, wherein the second layer that forms the connection portion covers a side surface of the insulator projecting upward from the upper surface of the core substrate, the second conductive film covers the side surface of the insulator projecting downward from the lower surface of the core substrate, and the connection portion is metallic.

2. The wiring substrate according to claim 1, wherein two wires of the at least two wires of the first conductive film are respectively connected to two of the connection terminals of the electronic component, and wherein the two wires each include a distal end facing the distal end of the other one of the two wires.

3. The wiring substrate according to claim 1, further comprising a through member extending through the core substrate between the upper and lower surfaces, wherein the through member electrically connects the wiring layer of the first wiring portion to the wiring layer of the second wiring portion.

4. The wiring substrate according to claim 3, wherein the through member includes an insulator that fills an interior of the through member.

5. The wiring substrate according to claim 1, wherein the first wiring portion includes an electrode exposed from an outermost surface of the first wiring portion for connection with a semiconductor chip, and the second wiring portion includes a connection pad exposed from an outermost surface of the second wiring portion for connection with another substrate.

6. The wiring substrate according to claim 1, wherein the first wiring portion includes a connection pad exposed from an outermost surface of the first wiring portion for connection with another substrate, and the second wiring portion includes an electrode exposed from an outermost surface of the second wiring portion for connection with a semiconductor chip.

7. The wiring substrate according to claim 1, wherein two wires of the at least two wires of the first conductive film are respectively connected to two of the connection terminals of the electronic component, and wherein the two wires each include a distal end facing and spaced apart from the distal end of the other one of the two wires by a distance of about 30 to 150 microns.

8. The wiring substrate according to claim 1, wherein the opening of the core substrate extends through the core substrate between a first opening at the upper surface of the core substrate and a second opening at the lower surface of the core substrate, the at least two wires of the first conductive film cover the first opening, and the second conductive film is larger than and covers the second opening.

9. The wiring substrate according to claim 1, wherein the first conductive film is formed directly on the upper surface of the core substrate, and all of the at least two, spaced apart wires are located coplanar with each other and cover the opening.

10. The wiring substrate according to claim 1, wherein the first layer that forms the electrode portion extends continuously from the central section of the opening to the upper surface of the core substrate.

11. The wiring substrate according to claim 1, wherein the first layer that forms the electrode portion extends proximally beyond the opening.

12. A method for manufacturing a wiring substrate, the method comprising:

forming an opening in a core substrate including an upper surface and a lower surface, wherein the opening extends through the core substrate between the upper surface and the lower surface;

applying a film, which covers the opening, to the upper surface of the core substrate;

arranging an electronic component in the opening and fixing the electronic component to the film, wherein the electronic component includes two connection terminals;

filling the opening with a first insulator, wherein the first insulator includes an upper surface, which is located at a higher level than the upper surface of the core substrate, and a lower surface, which is located at a lower level than the lower surface of the core substrate;

removing the film;

forming a conductive film that covers the first insulator, including
forming a first conductive film on the upper surface of the core substrate, wherein the first conductive film consists of at least two, spaced apart wires that are located coplanar with each other and cover the first insulator, the at least two, spaced apart wires connected to the two connection terminals of the electronic component, and
forming a second conductive film on the lower surface of the core substrate,
wherein the second conductive film covers the first insulator; and forming a first wiring portion by alternately stacking insulative layers and wiring layers on the upper surface of the core substrate while forming a second wiring portion by alternately stacking insulative layers and wiring layers on the lower surface of the core substrate, wherein each of the connection terminals of the electronic component includes an upper edge surface that is flush with the upper surface of the first insulator, each of the at least two, spaced apart wires is formed in a planar shape on the upper surface of the core substrate, the upper edge surface of each connection terminal, and the upper surface of the first insulator, each of the at least two, spaced apart wires of the first conductive film includes a first layer and a second layer, wherein:

the first layer of each of the at least two, spaced apart wires forms an electrode portion, wherein the first layer that forms the electrode portion extends horizontally and covers from a portion of the first insulator between the connection terminals, which is located at a central section of the opening, to the upper surface of the core substrate and the first layer that forms the electrode portion is arranged on and entirely covers the upper edge surface of each connection terminal exposed from the first insulator; and the second layer of each of the at least two, spaced apart wires forms a connection portion sandwiched between the first layer that forms the electrode portion and the upper surface of the core substrate, wherein the second layer that forms the connection portion covers a side surface of the first insulator projecting upward from the upper surface of the core substrate, the second conductive film covers the side surface of the first insulator projecting downward from the lower surface of the core substrate, and the connection portion is metallic.

13. The method according to claim 12, further comprising:

forming a through hole that extends through the core substrate between the upper-surface and the lower surface;

plating a wall of the through hole; and filling the through hole with a second insulator when filling the opening with the first insulator.

14. The method according to claim 13, wherein the first insulator and the second insulator are formed from the same resin.

* * * * *

UNITED STATES PATENT AND TRADEMARK OFFICE
CERTIFICATE OF CORRECTION

PATENT NO. : 9,773,747 B2  
APPLICATION NO. : 13/868449  
DATED : September 26, 2017  
INVENTOR(S) : Kazuhiro Kainuma et al.

Page 1 of 1

It is certified that error appears in the above-identified patent and that said Letters Patent is hereby corrected as shown below:

On the Title Page

Item (54) Title, Column 1, Line 2, delete "SUBTRATE" and insert -- SUBSTRATE --, therefor.

In the Specification

Column 1, Line 2, delete "SUBTRATE" and insert -- SUBSTRATE --, therefor.

Signed and Sealed this  
Twenty-sixth Day of December, 2017

Joseph Matal  
*Performing the Functions and Duties of the*  
*Under Secretary of Commerce for Intellectual Property and*  
*Director of the United States Patent and Trademark Office*